United States Patent [19]

Akoh

[11] Patent Number: 4,748,086

[45] Date of Patent: May 31, 1988

[54] FORMATION OF COPPER ELECTRODE ON CERAMIC OXIDE

[75] Inventor: Tetsuo Akoh, Chiba, Japan

[73] Assignee: TDK Corporation, Tokyo, Japan

[21] Appl. No.: 840,204

[22] Filed: Mar. 17, 1986

[30] Foreign Application Priority Data

Mar. 18, 1985 [JP] Japan .................... 60-54014

[51] Int. Cl.$^4$ ........................... C25D 5/50; C25D 5/54
[52] U.S. Cl. .................................. 428/433; 204/37.1;
204/38.4; 427/123; 427/124; 427/383.5;
428/469
[58] Field of Search ....................... 204/30, 37.1, 38.4;
427/96, 98, 123, 124, 383.5; 428/433, 469

[56] References Cited

U.S. PATENT DOCUMENTS

| | | | |
|---|---|---|---|
| 3,994,430 | 11/1976 | Cusano et al. | 228/122 |
| 4,129,243 | 12/1978 | Cusano et al. | 228/122 |
| 4,259,409 | 3/1981 | Arnold | 428/428 |
| 4,281,041 | 7/1981 | Koehler | 428/336 |
| 4,342,632 | 8/1982 | Heim et al. | 204/192 EC |
| 4,428,986 | 1/1984 | Schachameyer | 427/309 |
| 4,569,902 | 2/1986 | Saito | 430/313 |
| 4,647,477 | 3/1987 | DeLuca | 427/98 |

OTHER PUBLICATIONS

F. A. Lowenheim, *Electroplating*, McGraw-Hill Book Co., New York, 1978, pp. 416–418.

*Primary Examiner*—John F. Niebling
*Assistant Examiner*—W. T. Leader
*Attorney, Agent, or Firm*—Oblon, Fisher, Spivak, McClelland & Maier

[57] ABSTRACT

A copper electrode is firmly bonded to a sintered ceramic oxide body by applying a first copper film on a ceramic oxide body by electroless plating or vapor phase plating such as evaporation or sputtering, forming a second copper film thereon by electrolytic plating, and heat treating the copper films on the body at a temperature of 750° to 1065° C. in a weakly oxidizing atmosphere.

11 Claims, No Drawings

FORMATION OF COPPER ELECTRODE ON CERAMIC OXIDE

BACKGROUND OF THE INVENTION

This invention relates to the formation of a copper electrode on ceramic oxide, especially on a sintered ceramic oxide body.

It has long been investigated to bond metal to ceramic materials, particularly oxide ceramic materials. Most commonly known and widely used is the thick film process involving coating and baking of paste. The most widely used pastes are expensive Ag-Pd and Ag pastes which lead to an economical disadvantage although copper pastes are used in limited applications.

The paste is usually applied by the screen printing process which imposes a limit of about 100 $\mu$m to the minimum coating line width, which in turn, sets a bar to high integration. Most pastes which contain frits not only have a high interfacial resistance with the ceramic so that they are unsuitable in high frequency circuits, but are also disadvantageous in thermal conductivity. When wet plating such as nickel plating or soldering is carried out as a subsequent process, the plating solution is likely to attack the frits, detracting from electrical conductivity and bond strength as well as reliability. An alternative process is to form copper films by wet plating. This process is successful in increasing electrical conductivity, but results in an insufficient bond strength to use in practice.

It was also developed to bond a copper sheet to a ceramic by forming a Cu-O eutectic liquid phase (see Japanese Patent Application Kokai No. 52-37914). This method, however, is complicated because it involves the oxidation of copper surface and the formation of Cu-O eutectic liquid phase.

SUMMARY OF THE INVENTION

A primary object of the present invention is to provide a novel and improved method for forming a copper electrode on a ceramic oxide body in a simple and economic manner in high yields wherein the resulting metallized body exhibits improved bond strength between ceramic oxide and copper and high electric conductivity, and finds a wide range of applications.

The present invention is directed to a method for forming a copper electrode on a ceramic oxide body. According to the present invention, a first copper film is applied onto a ceramic oxide body by electroless plating or vapor phase plating. A second copper film is then formed on the first copper film by electrolytic plating. The resulting copper layer on the body is then heat treated at a temperature of 750° to 1065° C. in a weakly oxidizing atmosphere.

DETAILED DESCRIPTION OF THE INVENTION

Briefly stated, according to the present invention, a copper electrode is formed on a ceramic oxide body by forming a first copper film on the body by electroless plating or vapor phase plating, forming a second copper film on the first copper film by electrolytic plating, and then heat treating the assembly.

The first copper plating may be formed by electroless plating or vapor phase plating, more particularly, sputtering and vacuum deposition. The vapor phase plating processes including sputtering and vacuum deposition or evaporation may be in accord with conventional processes known per se.

The electroless plating may be carried out as follows. For example, a sintered alumina body is degreased in a 10% NaOH aqueous solution, etched with mixed acid solution containing HF, sensitized with a sensitizing agent such as $SnCl_2$, surface activated with an activator such as $PdCl_2$, and then subjected to electroless plating in a solution containing $CuSO_4$, ethylenediaminetetraacetic acid (EDTA), formalin, NaOH, etc.

The first copper films thus formed generally have a thickness of about 0.2 to 1.0 $\mu$m. Copper films having a thickness of more than 1 $\mu$m are reduced in density and thus increased in film resistance. In addition, such thicker films take a long time to achieve the thickness and thus consume the plating solution to lower the film formation efficiency, increasing the cost. Copper films of less than 0.2 $\mu$m thick have insufficient physical properties as a film.

After the first copper film is formed, the ceramic body is further subjected to electrolytic plating, for example, in a copper sulfate $CuSO_4$ bath to form an additional or second copper film in order to increase the thickness of the plating layer to the desired value. The thus plated body is cleaned and dried.

The thus formed copper layer consisting of the first and second copper films has a thickness in the range of from about 2 to about 30 $\mu$m. After the two stage formation, the copper layer may optionally be subjected to patterning.

The formation of copper layer is followed by a heat treatment at a temperature of 750° to 1065° C. A proper temperature may be suitably chosen in the range of from 750° to 1065° C., depending on the particular composition of ceramic oxide used. Temperatures immediately below the upper limit of 1065° C. are rather preferred for the purpose of reducing the heat treating time. Temperatures lower than 750° C. are difficult to achieve the desired bond strength between copper and ceramic and likely to oxidize copper. At temperatures higher than 1065° C., "blister" defects are liable to occur in copper films.

The heat treatment should be carried out in a weakly oxidizing atmosphere which may be an inert gas atmosphere having an oxygen concentration $P_{O2}$ of 2 to 25 ppm, and preferably 6 to 10 ppm. Oxygen concentrations of less than 2 ppm are too low to allow reactions of Cu to take place to form a composite oxide at the interface between the copper film and the ceramic oxide, thus failing to achieve a bond strength. At oxygen concentrations of higher than 25 ppm, copper is excessively oxidized to make the subsequent soldering difficult.

The heating time depends on the heat treating temperature and may be suitably chosen in accordance with the particular ceramic oxide composition and heating temperature employed.

Although the present invention is not restricted by the theory, it is believed that the bond between ceramic oxide and copper results from formation of a composite oxide at the interface. When a copper film is applied by wet or vapor plating, the contact area between Cu and ceramic oxide is microscopically greater while the inter-atomic contact distance between Cu and ceramic oxide is relatively short. This enables formation and interposition of a composite oxide by solid-phase reaction so that a firm bond is obtained even when the heating temperature is lower than 1065° C., the CuO eutectic temperature.

The ceramic oxide bodies which can be used in the practice of the present invention may be readily available or prepared by any well-known methods. Some illustrative non-limiting examples include sintered aluminum oxide ($Al_2O_3$) bodies, sintered bodies for use as dielectric resonators and containing $BaTiO_3$, $Nd_2O_3$, $Bi_2O_3$, $TiO_2$, and MnO, and sintered bodies for use in microwave substrates and containing $BaTiO_3$ and $SnO_2$.

The sintered bodies may be prepared in a conventional manner by mixing the necessary oxides, shaping the mixture into a compact, and sintering the compact. The sintering process may be any of reaction sintering, atmospheric pressure sintering, hot pressing, and hot isostatic pressing (HIP) processes.

Sintered ceramic oxide bodies are thus obtained and used as substrates for metallization of copper. A copper electrode may be formed on the ceramic oxide substrate in the predetermined pattern.

According to the method of the present invention, a copper electrode is formed on a ceramic oxide body by applying a first copper film on the body by wet or vapor plating, increasing the copper layer to the predetermined thickness by electrolytic plating, and effecting heat treatment at a temperature of 750° to 1065° C. in a weakly oxidizing atmosphere. The thus metallized body exhibits an increased bond strength between ceramic oxide and copper. The metallizing process is simple, easy and amenable to mass production. Since copper itself is highly electroconductive and inexpensive, the products have many advantages including electrical properties and economy.

High integration becomes possible because a copper layer may be formed over the entire surface of a ceramic oxide body according to the present method and then etched to the minimum line width of about 10 $\mu$m by the conventional photo-etching process.

The products thus find a variety of applications as hybrid integrated circuit substrates, microwave dielectric resonators, microwave transmission lines, semiconductor ceramic packages, and the like.

In order that those skilled in the art will better understand how to practice the present invention, examples are given below by way of illustration and not by way of limitation.

EXAMPLES

At the outset, a variety of sintered ceramic oxide bodies were prepared.

A sintered alumina body was prepared by adding to about 96 parts by weight of finely divided alumina ($Al_2O_3$), 4 parts by weight of finely divided magnesia (MgO) and silica ($SiO_2$) as a sintering aid and then an organic binder and an organic solvent. The mixture was thoroughly milled in a ball mill, for example, to form a ceramic slurry. The slurry was cast into a sheet by means of a suitable casting apparatus using a doctor blade. The sheet was sintered in a sintering furnace at an elevated temperature of 1,500° to 1,600° C., obtaining a sintered alumina body.

Another sintered body having a dielectric constant of 80 was prepared from a composition consisting essentially of $BaTiO_3 + Nd_2O_3 + Bi_2O_3 + TiO + MnO$.

A further sintered body was prepared from a composition consisting essentially of $BaTiO_3 + SnO_2$ by the method disclosed in Japanese patent application No. 58-73908.

The thus prepared ceramic oxide bodies of 35 mm$\times$25 mm by 0.7 mm thick was degreased in 10% NaOH aqueous solution, etched with a mixed acid solution containing 15% of HF, and sensitized with $SnCl_2$. The bodies were activated with $PdCl_2$ and then subjected to electroless copper plating in a bath containing $CuSO_4$, EDTA, formalin, NaOH, and a stabilizer.

The bodies were further subjected to electrolytic plating in a $CuSO_4$ bath until the copper plating reached a total thickness of about 7 to 8 $\mu$m, and subsequently cleaned and dried.

The wet-plated bodies were heat treated under conditions as indicated for temperature, atmosphere, and time in Table 1. A series of samples were prepared in accordance with the above procedure.

Comparative samples were also prepared by repeating the procedure except the heat treatment of copper film.

For the sintered alumina body and the sintered $BaTiO_3/SnO_2$ body, there were prepared samples having a copper film heat treated by the method described in Japanese patent application Kokai No. 52-37914.

All the copper films formed on these samples had dimensions of 2 mm by 2 mm by 7–8 $\mu$m thick.

The samples were examined for bond strength and film resistivity by the following tests.

Bond Strength Test

A copper wire having a diameter of 0.8 mm was extended parallel to one edge of the applied copper film and soldered to the film over the overlapped area. The wire extending from the soldered area was pulled by means of a tensile tester in a direction substantially perpendicular to the applied copper film interface so as to separate the copper film from the substrate. The load at which the film was separated from the substrate was recorded.

Film Resistivity

A sample of 1 mm wide by 88 mm long was measured for electric resistance R and for average film thickness t by means of a surface roughness meter. The film resistivity is then given by tR/88 in $\Omega$-cm.

The results are shown in Table 1.

TABLE 1

| Sample No. | Ceramic oxide | First copper film thickness ($\mu$m) | Heat treatment in $N_2$ Temp. (°C.) | $P_{O_2}$ (ppm) | Time (hr.) | Bond strength (kg) | Film resistivity ($\times 10^{-6}$ $\Omega$cm) |
|---|---|---|---|---|---|---|---|
| 101* | 96% alumina | 0.4 | — | — | — | 0.5 | 1.6 |
| 102 | 96% alumina | 0.4 | 800 | 6 | 10 | 1.6 | 1.6 |
| 103 | 96% alumina | 0.4 | 900 | 6 | 5 | 4.0 | 1.6 |
| 104* | 96% alumina | 0.4 | 900 | <1 | 5 | 0.8 | 1.6 |
| 105* | 96% alumina | 0.4 | 900 | 100 | 5 | copper electrode oxidized | >100 |
| 106* | 96% alumina | 2 | 900 | 6 | 5 | 4.0 | 1.8 |
| 107 | 96% alumina | 0.4 | 1000 | 6 | 2 | 4.5 | 1.6 |
| 108* | 96% alumina | ** | | | | 3.5 | 1.6 |

TABLE 1-continued

| Sample No. | Ceramic oxide | First copper film thickness (μm) | Heat treatment in $N_2$ Temp. (°C.) | $P_{O_2}$ (ppm) | Time (hr.) | Bond strength (kg) | Film resistivity ($\times 10^{-6}$ Ωcm) |
|---|---|---|---|---|---|---|---|
| 201* | $BaTiO_3$ + $Nd_2O_3$ + $Bi_2O_3$ + $TiO_2$ + MnO | 0.4 | — | — | — | 0.5 (blisters) | 1.6 |
| 202 | $BaTiO_3$ + $Nd_2O_3$ + $Bi_2O_3$ + $TiO_2$ + MnO | 0.4 | 800 | 6 | 1 | 3.4 | 1.6 |
| 203 | $BaTiO_3$ + $Nd_2O_3$ + $Bi_2O_3$ + $TiO_2$ + MnO | 0.4 | 900 | 6 | 1 | 3.5 | 1.6 |
| 204 | $BaTiO_3$ + $Nd_2O_3$ + $Bi_2O_3$ + $TiO_2$ + MnO | 0.4 | 1000 | 6 | 1 | 5.0 | 1.6 |
| 205* | $BaTiO_3$ + $Nd_2O_3$ + $Bi_2O_3$ + $TiO_2$ + MnO | 2 | 1000 | 6 | 1 | 4.9 | 1.8 |
| 301* | $BaTiO_3$ + $SnO_2$ | 0.4 | — | — | — | 0.4 | 1.6 |
| 302 | $BaTiO_3$ + $SnO_2$ | 0.4 | 800 | 6 | 1 | 1.5 | 1.6 |
| 303 | $BaTiO_3$ + $SnO_2$ | 0.4 | 900 | 6 | 1 | 1.9 | 1.6 |
| 304 | $BaTiO_3$ + $SnO_2$ | 0.4 | 1000 | 6 | 1 | 2.5 | 1.6 |
| 305* | $BaTiO_3$ + $SnO_2$ | 2 | 1000 | 6 | 1 | 2.5 | 1.8 |
| 306* | $BaTiO_3$+$SnO_2$ | | *** | | | 4.7 (blisters) | 1.6 |

*Comparison
**Japanese Pat. Appln. Kokai No. 52-37914, treating conditions: temperature 1070° C., $N_2$ atmosphere, and time 10 min.
***Japanese Pat. Appln. Kokai No. 52-37914, treating conditions: temperature 1070° C., $N_2$ atmosphere, and time 1 hour.

As seen from the data in Table 1, those samples prepared by appling a copper layer onto ceramic oxide by wet electroless plating and electrolytic plating, and heat treating at 750° to 1065° C. in a weakly oxidizing atmosphere displayed an increased bond strength. The copper layers have excellent electric conductivity as indicated by a low film resistivity.

Additional samples were prepared by repeating the procedure for sample Nos. 101–109 and 111–116 except that the electroless plating was replaced by vapor phase plating, specifically vacuum deposition or evaporation to apply copper on ceramic oxide substrates. A bond strength test was carried out on these samples to find that equivalent results were obtained.

These data prove the effect of the present invention.

I claim:

1. A method for forming a copper electrode on a ceramic oxide body, comprising:
    (a) forming a first copper film on a ceramic oxide body by electroless plating or vapor phase plating,
    (b) forming a second copper film on the first copper film by electrolytic plating, and
    (c) heat treating the resulting copper layer on the body at a temperature of 750° to 1065° C. in an inert gas atmosphere having an oxygen concentration of about 2 to 25 ppm.

2. The method of claim 1 wherein the first copper film has a thickness of about 0.2 to 1.0 μm.

3. The method of claim 1, wherein said first copper film and said second copper film together have a thickness of about 2 to 30 μm.

4. The method of claim 1, wherein said heat treatment is effected at a temperature of 750° to 1065° C. in an inert gas atmosphere having an oxygen concentration of about 6 to 10 ppm.

5. An article of manufacture, comprising a ceramic oxide body and a copper electrode formed thereon, said article being prepared by a method comprising:
    (a) forming a first copper film on a ceramic oxide body by electroless plating or vapor phase plating,
    (b) forming a second copper film on the first copper film by electrolytic plating, and
    (c) heat treating the resulting copper layer on the body at a temperature of 750° to 1065° C. in an inert gas atmosphere having an oxygen concentration of about 2 to 25 ppm.

6. The article of claim 5 wherein the first copper film has a thickness of about 0.2 to 1.0 μm and said first and said second copper films together have a total thickness of about 2 to 30 μm.

7. The article of claim 5 wherein the ceramic oxide body is selected from the group consisting of a sintered aluminum oxide body, a sintered body comprised of $BaTiO_3$, $Nd_2O_3$, $Bi_2O_3$, $TiO_2$, and MnO, and a sintered body comprised of $BaTiO_3$ and $SnO_2$.

8. The article of claim 5, wherein the ceramic oxide body is selected from the group consisting of a sintered aluminum oxide body and a sintered $BaTiO_3$ body.

9. The article of claim 5, wherein said heat treatment is effected at a temperature of 750° to 1065° C. in an inert gas atmosphere having an oxygen concentration of about 6 to 10 ppm.

10. The article of claim 5, wherein said ceramic oxide bodies are formed by mixing one or more of the respective oxides, shaping the mixture into a compact and sintering the compact.

11. The article of claim 10, wherein said compact is sintered by reaction sintering, atmospheric pressure sintering, hot pressing and hot isostatic pressing.

* * * * *